(12) United States Patent
Patzer et al.

(10) Patent No.: US 8,765,542 B1
(45) Date of Patent: Jul. 1, 2014

(54) METHODS OF FORMING A SEMICONDUCTOR DEVICE WHILE PREVENTING OR REDUCING LOSS OF ACTIVE AREA AND/OR ISOLATION REGIONS

(71) Applicant: GLOBALFOUNDARIES Inc., Grand Cayman (KY)

(72) Inventors: Joachim Patzer, Langebruck (DE); Frank Seliger, Dresden (DE); Markus Lenski, Dresden (DE); Stephan Kronholz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/765,797

(22) Filed: Feb. 13, 2013

(51) Int. Cl.
*H01L 21/8238* (2006.01)

(52) U.S. Cl.
USPC ........... 438/199; 438/218; 438/595; 438/735; 257/E21.632

(58) Field of Classification Search
USPC ......... 438/199, 207, 218–219, 299–300, 303, 438/591–592, 595, 734–739; 257/E21.632
See application file for complete search history.

(56) References Cited

U.S. PATENT DOCUMENTS

2013/0034942 A1* 2/2013 Pal et al. .................... 438/285

* cited by examiner

*Primary Examiner* — Thanhha Pham
(74) *Attorney, Agent, or Firm* — Amerson Law Firm, PLLC

(57) ABSTRACT

One method disclosed includes forming a gate structure of a transistor above a surface of a semiconducting substrate, forming a sidewall spacer proximate the gate structure, forming a sacrificial layer of material above the protective cap layer, sidewall spacer and substrate, forming an OPL layer above the sacrificial layer, reducing a thickness of the OPL layer such that, after the reduction, an upper surface of the OPL layer is positioned at a level that is below a level of an upper surface of the protective cap layer, performing a first etching process to remove the sacrificial layer from above the protective cap layer to expose the protective cap layer for further processing, performing a second etching process to remove the protective cap layer and performing at least one process operation to remove at least one of the OPL layer or the sacrificial layer from above the surface of the substrate.

16 Claims, 5 Drawing Sheets

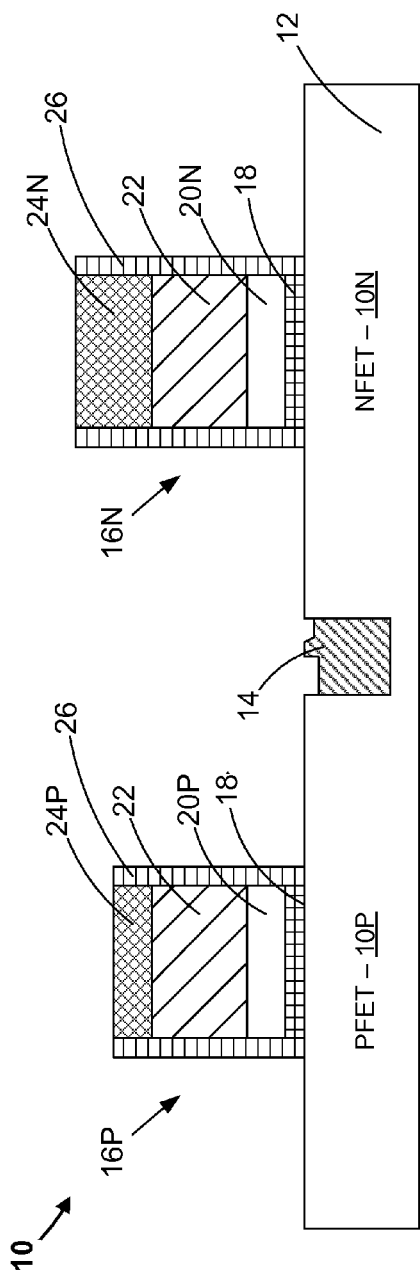
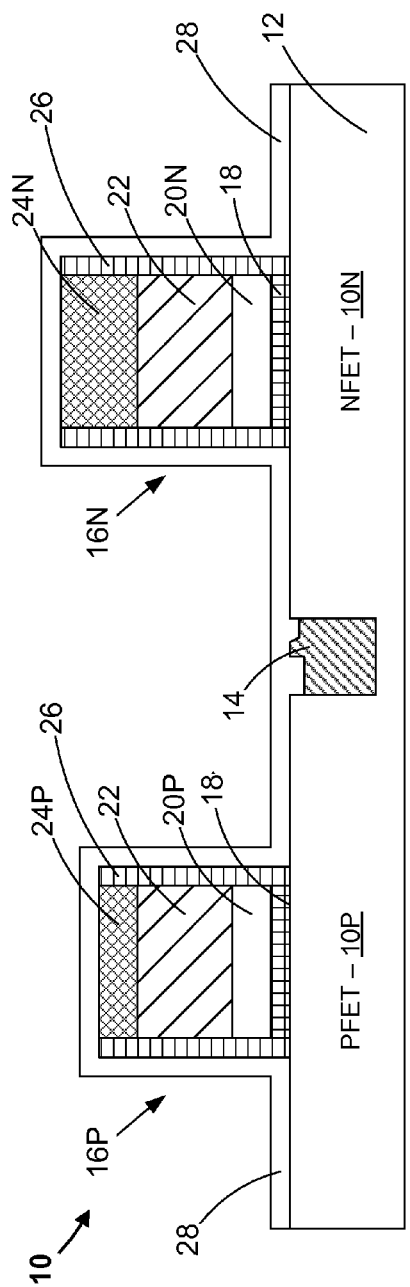
Figure 1A (Prior Art)
Figure 1B (Prior Art)

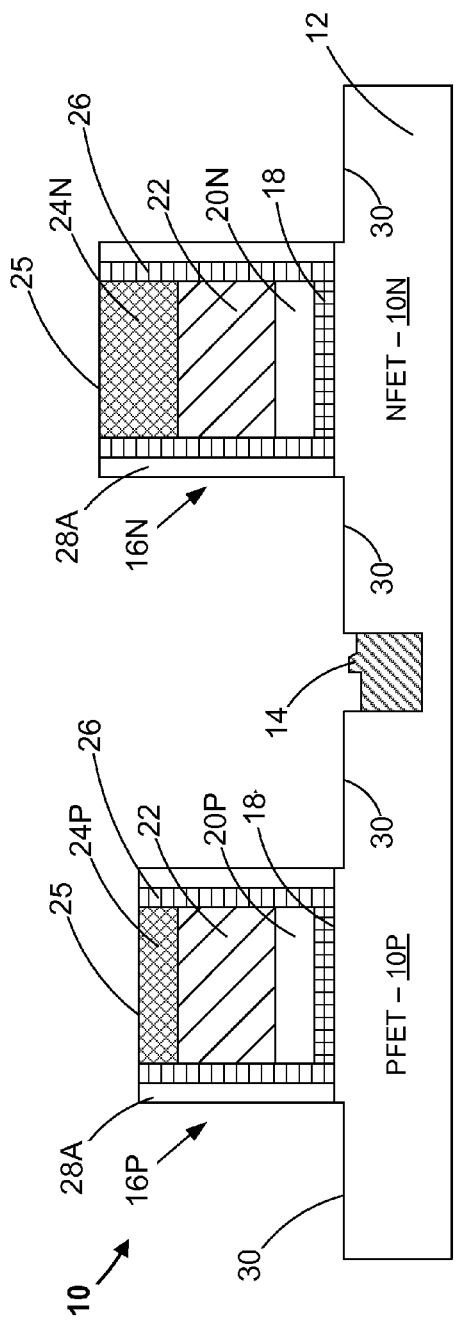
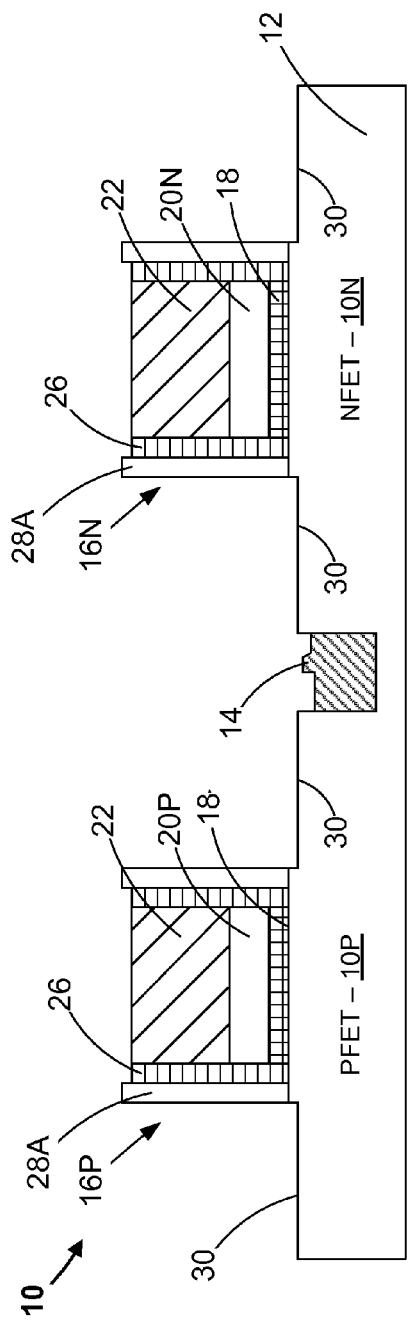
Figure 1C (Prior Art)
Figure 1D (Prior Art)

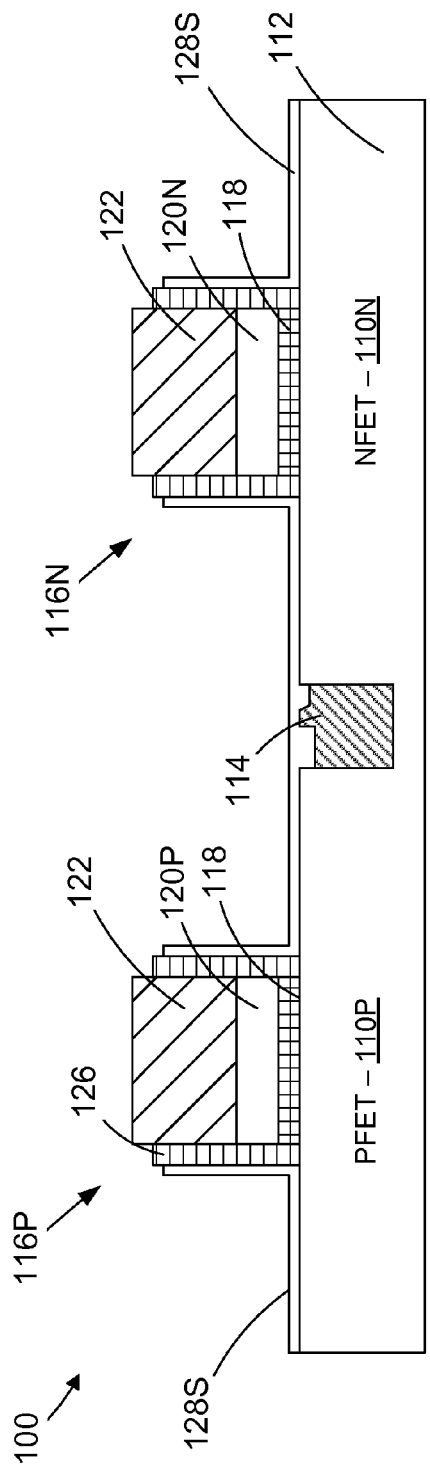
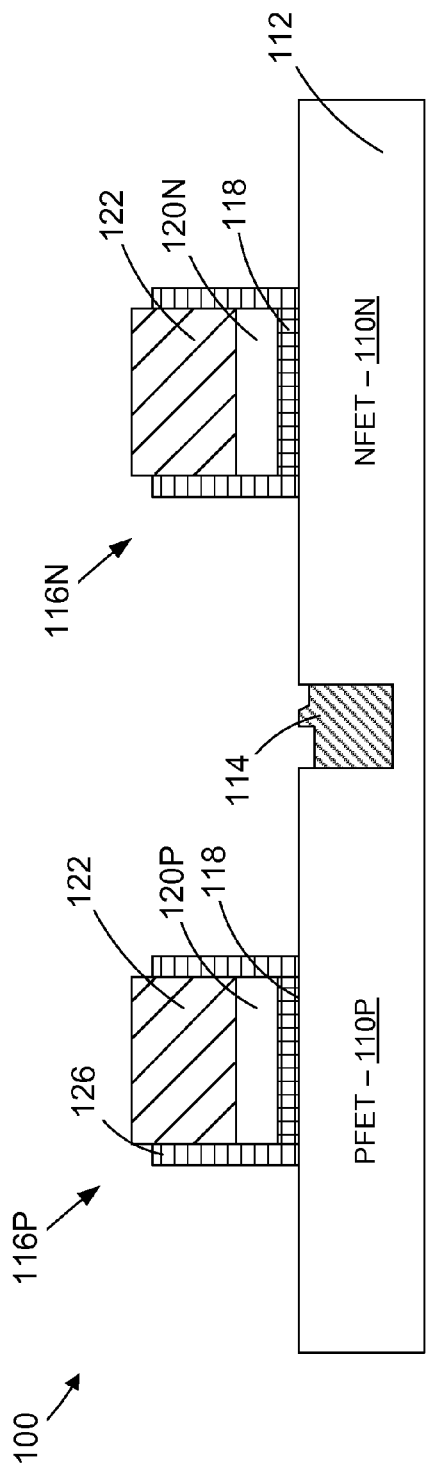

METHODS OF FORMING A SEMICONDUCTOR DEVICE WHILE PREVENTING OR REDUCING LOSS OF ACTIVE AREA AND/OR ISOLATION REGIONS

BACKGROUND OF THE INVENTION

1. Field of the Invention

Generally, the present disclosure relates to the manufacture of sophisticated semiconductor devices, and, more specifically, to various methods of forming semiconductor devices while preventing or reducing loss of active area and/or isolation regions.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region and separated therefrom by a gate insulation layer. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and to prevent the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

For many early device technology generations, the gate structures of most transistor devices, whether a planar device or a 3D device, have been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-20 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

There are two well-known processing methods for forming a planar or 3D transistor with a high-k/metal gate structure: (1) the so-called "gate last" or "replacement gate" technique; and (2) the so-called "gate first" technique. In the replacement gate technique, a so-called "dummy" or sacrificial gate structure is initially formed and remains in place as many process operations are performed to form the device, e.g., the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed. In general, using the "gate first" technique involves forming a stack of layers of material across the substrate, wherein the stack of materials includes a high-k gate insulation layer, one or more metal layers, a layer of polysilicon and a protective cap layer, e.g., silicon nitride. Thereafter, one or more etching processes are performed to pattern the stack of materials to thereby define the basic gate structures for the transistor devices.

FIGS. 1A-1D depict one illustrative prior art "gate first" technique that will be discussed in connection with some problems that may arise when using the gate first technique. As shown in FIG. 1A, the integrated circuit product 10 includes an illustrative PFET device 10P and an NFET device 10N that are formed in active regions of a semiconducting substrate 12. An illustrative trench isolation region 14 electrically isolates the devices 10P, 10N from one another. At the point of fabrication depicted in FIG. 1A, the gate structures 16P, 16N have been formed for the PFET device 10P and NFET device 10N, respectively. In the depicted example, the isolation region 14 has an uneven or gouged upper surface due to the undesirable consumption of some of the isolation regions 14 during previous processing operations. The gate structures 16P, 16N are generally comprised of a high-k gate insulation layer 18, one or more metal layers 20P, 20N, a layer of polysilicon 22 and gate cap layers 24P, 24N. Also depicted in FIG. 1A are illustrative sidewall spacers 26, e.g., silicon nitride. The number of metal layers and the types of metal layers employed in the PFET device 10P and NFET device 10N may be different. In general, the gate cap layer 24N on the NFET device 10N tends to be thicker than the gate cap layer 24P on the PFET device 10P. This situation typically occurs because an additional hard mask layer is formed on the NFET device 10N when silicon/germanium material (not shown) is grown in cavities (not shown) that were formed in the substrate 12 adjacent the gate structure 16P for the PFET device 10P.

The protective cap layers 24P, 24N and the spacers 26 were formed to protect the gate structures 16P, 16N from subsequent processing operations after the gates were patterned. At the point of processing depicted in FIG. 1A, the protective cap layers 24P, 24N must be removed so that a metal silicide region may be formed in the polysilicon gate material 22 so as to thereby reduce its contact resistance. But, it is also desirable that the spacers 26 remain in place so as to protect the gate structures 16P, 16N. Unfortunately, the spacers 26 and the gate cap layers 24P, 24N are typically made of the same material, e.g., silicon nitride, due to the effectiveness of that material in terms of being able to withstand many common processing operations and thereby provide good protection to the gate structures 16P, 16N. Thus, it is desirable that the gate cap layers 24P, 24N be removed while leaving in place the sidewall spacers 26.

As shown in FIG. 1B, a relatively thin layer of silicon dioxide 28 is deposited across the product 10. The purpose of the layer 28 is to protect the sidewall spacer 26 when the gate cap layers 24P, 24N are removed.

FIG. 1C depicts the device 10 after a dry, anisotropic etching process has been performed to remove all of the horizontally positioned portions of the layer of silicon dioxide 28. This results in the formation of spacer-type layers of silicon dioxide 28A on the sidewall spacer 26. This etching process operation exposes the upper surface 25 of the cap layers 24P, 24N so that they may subsequently be removed. Unfortunately, the etching process that is used to remove portions of the layer of silicon dioxide 28 also etches undesirable recesses 30 in the active regions of the substrate 12 and consumes additional portions of the isolation region 14. The depth of the recesses 30 may vary depending upon the particular application, e.g., the recesses may have a depth that falls within the range of about 7-21 nm. Loss of material in the active region can result in performance loss for the device, e.g., the extension implants for the device may be located deeper in the substrate due to the loss of active region material, which may lead to different electrical behavior for the device. FIG. 1D depicts the device 10 after an etching process was performed to remove the gate cap layers 24P, 24N. The etching process also recesses the spacers 26 to a limited degree.

The present disclosure is directed to various methods of forming semiconductor devices while preventing or reducing loss of active area and/or isolation regions that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices while preventing or reducing loss of active area and/or isolation regions. One illustrative method disclosed herein includes forming a gate structure of a transistor above a surface of a semiconductor substrate, forming a sidewall spacer proximate the gate structure, forming a sacrificial layer of material above the protective cap layer, the sidewall spacer and the substrate, forming an OPL layer above the sacrificial layer, reducing a thickness of the OPL layer such that, after the reduction, an upper surface of the OPL layer is positioned at a level that is below a level of an upper surface of the protective cap layer, with the OPL layer in position, performing a first etching process to remove the sacrificial layer from above the protective cap layer to thereby expose the protective cap layer for further processing, performing at least one second etching process to remove the protective cap layer and, after removing the protective cap layer, performing at least one process operation to remove at least one of the OPL layer or the sacrificial layer from above the surface of the substrate.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art gate first technique that may be employed in forming an HK/MG structure for a transistor device; and FIGS. 2A-2F depict various embodiments of various methods disclosed herein for forming semiconductor devices while preventing or reducing loss of active area and/or isolation regions.

Figure 2A:
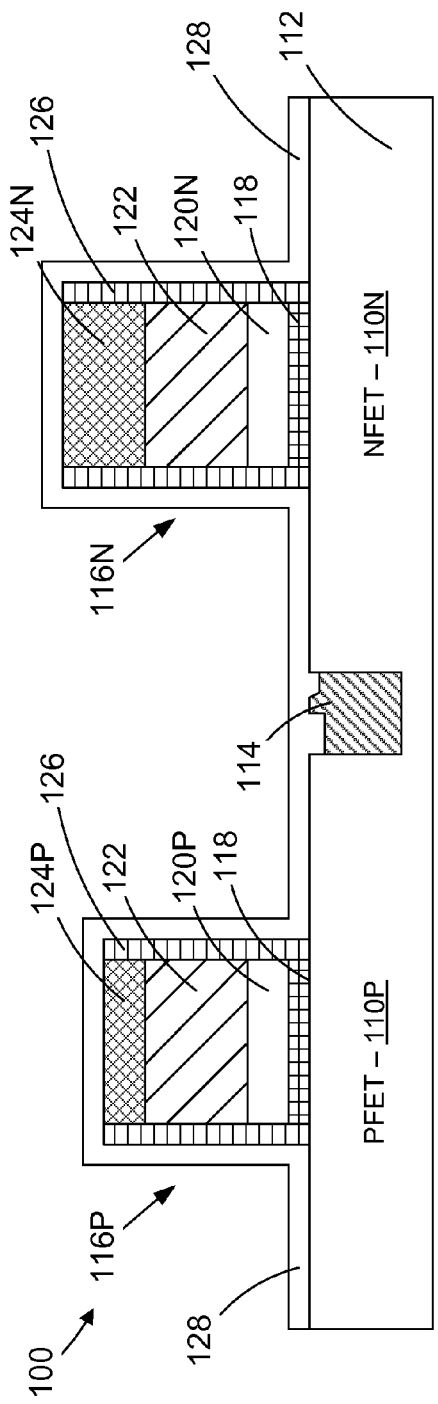

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming semiconductor devices while preventing or reducing loss of active area and/or isolation regions. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to the attached drawings, various illustrative embodiments of the methods and devices disclosed herein will now be described in more detail.

FIGS. 2A-2F depict an example of one illustrative method disclosed herein. As shown in FIG. 2A, the integrated circuit product 100 includes an illustrative PFET device 110P and an NFET device 110N that are formed in active regions of a semiconducting substrate 112. An illustrative trench isolation region 114 electrically isolates the devices 110P, 110N from one another. The substrate 112 may have a variety of configurations, such as the depicted bulk silicon configuration. The substrate 112 may also have a silicon-on-insulator (SOI) configuration that includes a bulk silicon layer, a buried insulation layer and an active layer, wherein semiconductor devices are formed in and above the active layer. Thus, the terms "substrate" or "semiconductor substrate" should be understood to cover all forms of semiconductor structures. The substrate 112 may also be made of materials other than silicon.

At the point of fabrication depicted in FIG. 2A, illustrative gate structures 116P, 116N have been formed for the PFET device 110P and NFET device 110N, respectively. In the depicted example, the isolation region 114 has an uneven or gouged upper surface due to the undesirable consumption of some of the isolation region 114 during previous processing operations. The gate structures 116P, 116N are generally comprised of a high-k gate insulation layer 118, one or more metal layers 120P, 120N, a layer of polysilicon 122 and gate cap layers 124P, 124N. Also depicted in FIG. 2A are illustrative sidewall spacers 126, e.g., silicon nitride. The number of metal layers and the types of metal layers employed in the PFET device 110P and NFET device 110N may be different. In general, the gate cap layer 124N on the NFET device 110N tends to be thicker than the gate cap layer 124P on the PFET device 110P. This situation typically occurs because an additional hard mask layer is formed on the NFET device 110N when silicon/germanium material (not shown) is grown in cavities (not shown) that were formed in the substrate 112 adjacent the gate structure 116P for the PFET device 110P. Also depicted in FIG. 2A is a relatively thin sacrificial layer of silicon dioxide 128 (e.g., about 5-7 nm) that has been conformally deposited across the product 100. The purpose of the sacrificial layer 128 is to protect the sidewall spacer 126 when the gate cap layers 124P, 124N are removed. The point of fabrication depicted in FIG. 2A corresponds approximately to the point of manufacture depicted in FIG. 1B.

Figure 2B:
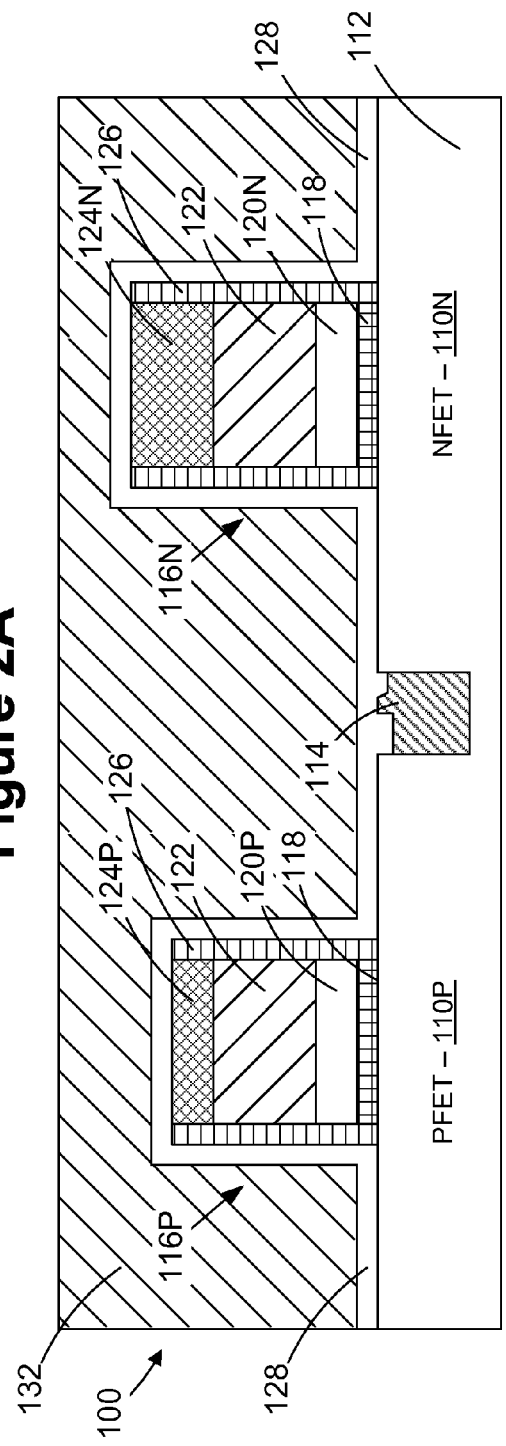

FIG. 2B depicts the device after an OPL layer 132 has been formed across the product 100. The OPL ("Optical Planarization Layer") layer 132 may be comprised of a variety of different materials and it may be formed using a variety of known techniques. For example, the OPL layer 132 may be a layer of CHM701B, commercially available from Cheil Chemical Co., Ltd., HM8006 and HM8014, commercially available from JSR Corporation, and ODL-102, commercially available from ShinEtsu Chemical, Co., Ltd. Based upon existing work, the HM8006 has exhibited the best planarization behavior to date. The OPL layer 132 may be formed by performing a spin-coating process and thereafter drying the OPL material. As indicated in FIG. 2B, the OPL layer 132 is formed to a sufficient thickness such that it overfills the space between the gate structures 116P, 116N.

Figure 2C:
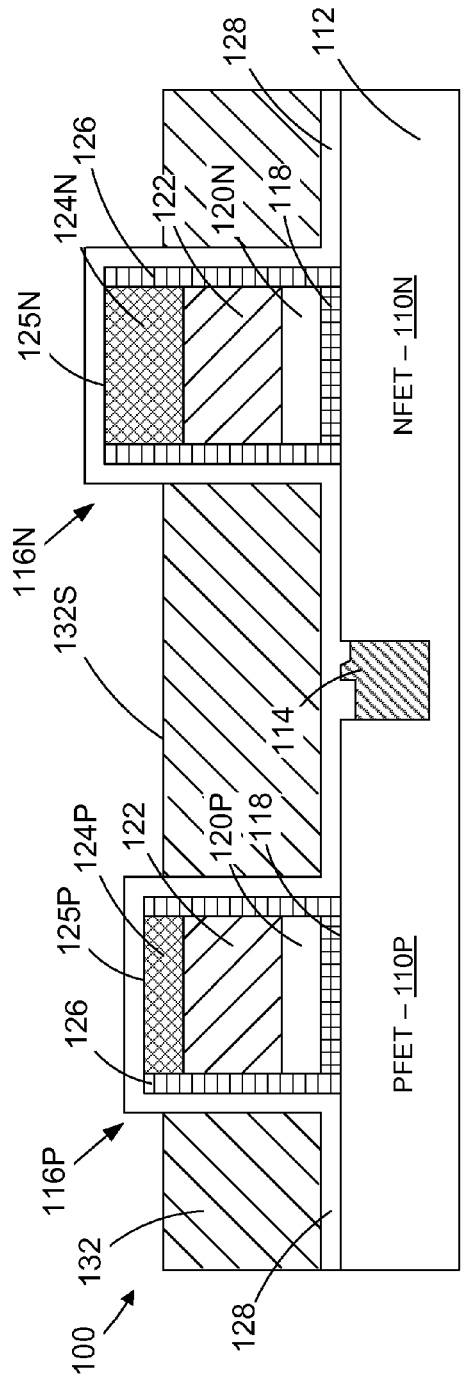

Next, as shown in FIG. 2C, a dry etching process is performed on the OPL layer 132 to reduce its overall thickness such that, after the etching process, the upper surface 132S of the etched OPL layer 132 is below the upper surfaces 125P, 125N of the protective cap layers 124P, 124N, respectively, formed above all of the polysilicon gates 122. In the depicted example, the etching process is performed for a sufficient duration such that the upper surface 132S of the OPL layer 132 is below the upper surface 125P of the protective cap layer 124P on the PFET device 110P. The etching chemistry employed to etch the OPL layer 132 may be, for example, an argon/oxygen based etching process that is timed to achieve the final desired post-etch thickness of the OPL layer 132.

Figure 2D:
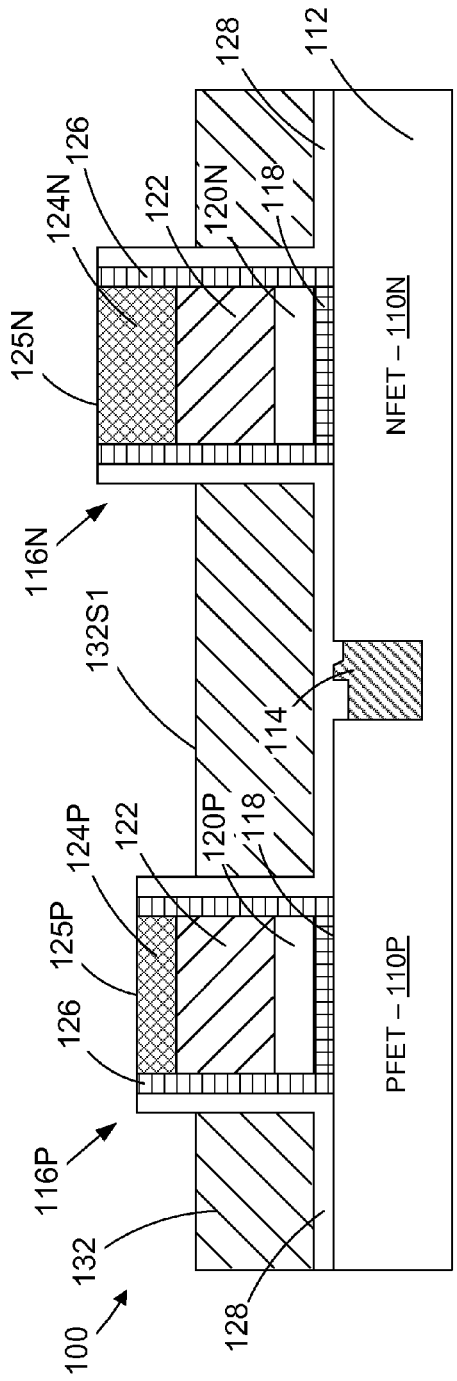

FIG. 2D depicts the product 100 after a dry, anisotropic etching process was performed to remove all of the horizontally positioned portions of the sacrificial layer of silicon dioxide 128. The etching process may be performed with a variety of etchant materials, e.g., $CHF_3/He$. This etching process operation exposes the upper surface 125P, 125N of the cap layers 124P, 124N, respectively, so that the protective cap layers may be subsequently removed. During this etching process, the OPL layer 132 provides additional protection of the substrate 112 and the isolation region 114. As depicted, it is anticipated that some of the OPL layer 132 may be consumed in this etching process. FIG. 2D depicts the situation where, after this etching process was performed on the sacrificial layer 128, the upper surface 132S1 of the OPL layer 132 has been lowered relative to the position of the surface 132S shown in FIG. 2C. Note that, unlike the prior art method discussed above, the horizontal portions of the sacrificial layer 128 positioned above the substrate 112 and the isolation region 114 are protected by the OPL layer 132 during this etching process.

FIG. 2E depicts the product after an etching process was performed to remove the protective cap layers 124P, 124N. The exact nature of this etching process may vary depending upon the particular application. In one example, the etching process performed to remove the protective cap layers 124P, 124N may comprise a main etching process (that is relatively aggressive) to etch through most of the cap layers, followed by performing a less aggressive over-etch process to complete the removal of the last portions of the cap layers 124P, 124N. As indicated in FIGS. 2D-2E, the OPL layer 132 is present at the beginning of this etching process but it may, in some applications, be completely consumed (as reflected in FIG. 2E) by the time the cap layers 124P, 124N are completely removed. In some applications, the OPL layer 132 may be substantially removed and the underlying portions of the sacrificial layer 128 may be attacked during this etching process, as reflected by the reduced-thickness sacrificial layer 128S. Although not depicted in the drawings, in other applications, after the cap layers 124P, 124N are removed, there still may be remnants of the OPL layer 132 positioned above the horizontal portions of the sacrificial layer 128.

FIG. 2F depicts the device after the sacrificial layer 128S has been removed from the product 100 and the product is ready for additional processing. In one embodiment, a plasma-strip process is performed to insure that any residual portions of the OPL layer 132 are removed from the product 100. Thereafter, the remaining portions of the sacrificial layer 128 may be removed using a variety of known techniques, e.g., by performing an HF stripping process. At the point of fabrication depicted in FIG. 2F, traditional fabrication processes may be performed to complete the formation of the product 100, e.g., the formation of various doped regions in the substrate 112, the formation of metal silicide regions in the polysilicon layers 122 of the gate structures 116P, 116N, the formation of various metallization layers (not shown), etc. In one illustrative embodiment, the various etching processes described above may be performed in a single process chamber without removing the substrate from the chamber wherein appropriate changes are made to the etch chemistry to etch the desired materials as described above. It should also be noted that, due to the use of the OPL layer 132 to protect portions of the sacrificial layer 128 during at least some of the etching processes described above, the horizontal portions of the sacrificial layer are better able to protect the substrate 112 and the isolation region 114 from attack as was described with reference to the prior art method disclosed above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate structure of a transistor above a surface of a semiconductor substrate, said gate structure being comprised of at least one layer of metal, a silicon-containing layer of material positioned above said at least one layer of metal and a protective cap layer positioned above the silicon-containing layer of material;
    forming a sidewall spacer proximate said gate structure;
    after forming said sidewall spacer, forming a sacrificial layer of material above said protective cap layer, above said sidewall spacer and above said semiconductor substrate;
    forming an OPL layer above said sacrificial layer;
    reducing a thickness of said OPL layer such that, after said reduction, an upper surface of said OPL layer is positioned at a level that is below a level of an upper surface of said protective cap layer;
    with said OPL layer in position, performing a first etching process to remove said sacrificial layer from above said protective cap layer to thereby expose said protective cap layer for further processing;
    performing at least one second etching process to remove said protective cap layer; and
    after removing said protective cap layer, performing at least one process operation to remove at least one of said OPL layer or said sacrificial layer from above said surface of said semiconductor substrate.

2. The method of claim 1, wherein said sidewall spacer and said protective cap layer are comprised of silicon nitride, said sacrificial layer is comprised of silicon dioxide and said layer of silicon-containing material is a layer of polysilicon.

3. The method of claim 1, wherein said OPL layer is comprised of one of CHM701B (commercially available from Cheil Chemical Co., Ltd.), HM8006 or HM8014 (both commercially available from JSR Corporation) or ODL-102 (commercially available from ShinEtsu Chemical, Co., Ltd.).

4. The method of claim 1, wherein performing said at least one second etching process comprises performing a main etch process followed by performing an over-etch process.

5. The method of claim 1, wherein said steps of reducing said thickness of said OPL layer, performing said first etching process and performing said at least one second etching process are all performed in a single process chamber without removing said semiconductor substrate from said chamber.

6. The method of claim 1, wherein performing said at least one process operation to remove at least one of said OPL layer or said sacrificial layer from above said surface of said semiconductor substrate comprises performing at least one of a plasma stripping process and an HF acid stripping process.

7. A method, comprising:
    forming a gate structure of a transistor above a surface of a semiconductor substrate, said gate structure being comprised of at least one layer of metal, a silicon-containing layer of material positioned above said at least one layer of metal and a protective cap layer positioned above said silicon-containing layer of material;
    forming a sidewall spacer such that it contacts a sidewall of said gate structure;
    after forming said sidewall spacer, forming a sacrificial layer of material on an upper surface of said protective cap layer, on said sidewall spacer and on said surface of said semiconductor substrate;
    forming an OPL layer on said sacrificial layer;
    reducing a thickness of said OPL layer such that, after said reduction, an upper surface of said OPL layer is positioned at a level that is below a level of said upper surface of said protective cap layer;
    with said OPL layer in position, performing a first etching process to remove said sacrificial layer from above said protective cap layer to thereby expose said protective cap layer for further processing;
    performing at least one second etching process to remove said protective cap layer; and
    after removing said protective cap layer, performing at least one process operation to remove at least one of said OPL layer or said sacrificial layer from above said surface of said semiconductor substrate.

8. The method of claim 7, wherein said OPL layer is comprised of one of CHM701B (commercially available from Cheil Chemical Co., Ltd.), HM8006 or HM8014 (both commercially available from JSR Corporation) or ODL-102 (commercially available from ShinEtsu Chemical, Co., Ltd.).

9. The method of claim 7, wherein performing said at least one second etching process comprises performing a main etch process followed by performing an over-etch process.

10. The method of claim 7, wherein said steps of reducing said thickness of said OPL layer, performing said first etching process and performing said at least one second etching process are all performed in a single process chamber without removing said semiconductor substrate from said chamber.

11. The method of claim 7, wherein performing said at least one process operation to remove at least one of said OPL layer or said sacrificial layer from above said surface of said semiconductor substrate comprises performing at least one of a plasma stripping process and an HF acid stripping process.

12. A method, comprising:
  forming a gate structure of a transistor above a surface of a semiconducting substrate, said gate structure being comprised of at least one layer of metal, a layer of polysilicon positioned above said at least one layer of metal and a protective cap layer positioned above said layer of polysilicon, said protective cap layer being comprised of silicon nitride;
  forming a sidewall spacer such that it contacts a sidewall of said gate structure, said sidewall spacer being comprised of silicon nitride;
  after forming said sidewall spacer, forming a sacrificial layer of silicon dioxide on an upper surface of said protective cap layer, on said sidewall spacer and on said surface of said semiconductor substrate;
  forming an OPL layer on said sacrificial layer;
  with said semiconductor substrate positioned in a process chamber, reducing a thickness of said OPL layer such that, after said reduction, an upper surface of said OPL layer is positioned at a level that is below a level of said upper surface of said protective cap layer;
  with said semiconductor substrate positioned in said process chamber and with said OPL layer in position, performing a first etching process in said process chamber to remove said sacrificial layer from above said protective cap layer to thereby expose said protective cap layer for further processing;
  with said semiconductor substrate positioned in a process chamber, performing at least one second etching process in said process chamber to remove said protective cap layer; and
  after removing said protective cap layer, performing at least one process operation to remove at least one of said OPL layer or said sacrificial layer from above said surface of said semiconductor substrate.

13. The method of claim 12, wherein said OPL layer is comprised of one of CHM701B (commercially available from Cheil Chemical Co., Ltd.), HM8006 or HM8014 (both commercially available from JSR Corporation) or ODL-102 (commercially available from ShinEtsu Chemical, Co., Ltd.).

14. The method of claim 12, wherein performing said at least one second etching process comprises performing a main etch process followed by performing an over-etch process.

15. The method of claim 12, wherein said steps of reducing said thickness of said OPL layer, performing said first etching process and performing said at least one second etching process are all performed in a single process chamber without removing said semiconductor substrate from said chamber.

16. The method of claim 12, wherein performing said at least one process operation to remove at least one of said OPL layer or said sacrificial layer from above said surface of said semiconductor substrate comprises performing at least one of a plasma stripping process and an HF acid stripping process.

* * * * *